United States Patent

(12) United States Patent
Nakaiso et al.

(10) Patent No.: US 9,704,847 B2
(45) Date of Patent: Jul. 11, 2017

(54) VARIABLE CAPACITANCE DEVICE

(71) Applicant: Murata Manufacturing Co., Ltd., Nagaokakyo-shi, Kyoto-fu (JP)

(72) Inventors: Toshiyuki Nakaiso, Nagaokakyo (JP); Nobuo Sakai, Nagaokakyo (JP)

(73) Assignee: Murata Manufacturing Co., Ltd., Nagaokakyo-shi, Kyoto-Fu (JP)

( * ) Notice: Subject to any disclaimer, the term of this patent is extended or adjusted under 35 U.S.C. 154(b) by 0 days.

(21) Appl. No.: 15/239,196

(22) Filed: Aug. 17, 2016

(65) Prior Publication Data

US 2016/0351556 A1    Dec. 1, 2016

Related U.S. Application Data

(63) Continuation of application No. PCT/JP2015/057814, filed on Mar. 17, 2015.

(30) Foreign Application Priority Data

Apr. 3, 2014  (JP) .................. 2014-077102

(51) Int. Cl.
*H01L 27/02*  (2006.01)
*H01L 27/08*  (2006.01)
(Continued)

(52) U.S. Cl.
CPC ........ *H01L 27/0248* (2013.01); *B81B 7/0022* (2013.01); *H01G 7/06* (2013.01);
(Continued)

(58) Field of Classification Search
CPC ......... G06K 7/10336; G06K 19/07779; G06K 19/077; G06K 19/07; H01Q 5/10;
(Continued)

(56) References Cited

U.S. PATENT DOCUMENTS 3,569,795 A * 3/1971 Gikow .................... H01G 7/06
361/321.1
5,438,023 A * 8/1995 Argos, Jr. ............ H01L 23/291
257/E23.118
(Continued)

FOREIGN PATENT DOCUMENTS

JP      2003229428 A    8/2003
JP      2008532308 A    8/2008
(Continued)

OTHER PUBLICATIONS

International Search Report issued for PCT/JP2015/057814, date of mailing Jun. 9, 2015.
(Continued)

*Primary Examiner* — Jarrett Stark
(74) *Attorney, Agent, or Firm* — Arent Fox LLP

(57) ABSTRACT

A variable capacitance device that includes a semiconductor substrate, a redistribution layer disposed on a surface of the semiconductor substrate, and a plurality of terminal electrodes including first and second input/output terminals, a ground terminal and a control voltage application terminal. Moreover, a variable capacitance element section is formed in the redistribution layer from a pair of capacitor electrodes connected to the first and second input/output terminals, respectively, and a ferroelectric thin film disposed between the capacitor electrodes. Further, an ESD protection element is connected between the one of the input/output terminals and the ground terminal is formed on the surface of the semiconductor substrate.

16 Claims, 15 Drawing Sheets

(51) Int. Cl.
*B81B 7/00* (2006.01)
*H01L 29/93* (2006.01)
*H01G 7/06* (2006.01)
*H01L 49/02* (2006.01)

(52) U.S. Cl.
CPC .......... *H01L 27/0805* (2013.01); *H01L 29/93* (2013.01); *B81B 2201/0221* (2013.01); *H01L 28/55* (2013.01)

(58) Field of Classification Search
CPC ...... H01Q 1/243; H01Q 1/2225; H01Q 7/005; H01G 7/00; H04B 5/0081; H04B 5/0062; H04B 5/02
See application file for complete search history.

(56) References Cited

U.S. PATENT DOCUMENTS

| | | | | |
|---|---|---|---|---|
| 5,751,540 | A * | 5/1998 | Lee | H01L 28/75 257/295 |
| 9,047,524 | B2 * | 6/2015 | Ikemoto | H04B 5/0062 |
| 2001/0042867 | A1 * | 11/2001 | Furuhata | H01L 29/7371 257/197 |
| 2007/0222551 | A1 * | 9/2007 | Lai | H01C 1/14 338/307 |
| 2008/0258257 | A1 | 10/2008 | Klee et al. | |
| 2010/0020469 | A1 | 1/2010 | Kurioka et al. | |
| 2010/0309710 | A1 * | 12/2010 | Evans, Jr. | G11C 11/22 365/145 |
| 2012/0045881 | A1 | 2/2012 | Roest et al. | |
| 2014/0225793 | A1 | 8/2014 | Ikemoto et al. | |
| 2015/0243442 | A1 | 8/2015 | Kanno et al. | |
| 2016/0293778 | A1 * | 10/2016 | Bao | H01L 29/94 |

FOREIGN PATENT DOCUMENTS

| | | |
|---|---|---|
| JP | 4502609 B2 | 7/2010 |
| JP | 5000660 B2 | 8/2012 |
| JP | 2013214560 A1 | 10/2013 |
| JP | 2014036120 A | 2/2014 |
| WO | WO 2011021411 A1 | 2/2011 |
| WO | WO 2013061985 A1 | 5/2013 |
| WO | WO 2013183472 A1 | 12/2013 |

OTHER PUBLICATIONS

Written Opinion of the International Searching Authority issued for PCT/JP2015/057814, date of mailing Jun. 9, 2015.

* cited by examiner (1)

(2)

(3)

(4)

(5)

(6)

(7)

(8)

(9)

(10)

(11)

VARIABLE CAPACITANCE DEVICE

CROSS REFERENCE TO RELATED APPLICATIONS

The present application is a continuation of PCT/JP2015/057814 filed Mar. 17, 2015, which claims priority to Japanese Patent Application No. 2014-077102, filed Apr. 3, 2014, the entire contents of each of which are incorporated herein by reference.

TECHNICAL FIELD

The present disclosure relates to a variable capacitance device used for a communication device for a Radio Frequency Identification (RFID) system or a Near Field Communication (NFC) system, for example.

BACKGROUND

Conventionally, variable capacitance elements whose dielectric constant is changed by a control voltage are proposed by Patent Literatures 1 and 2, for example. These variable capacitance elements adopt a laminated structure (i.e., an MIM structure) of a metal, a ferroelectric material, and a metal, and are provided with a ferroelectric thin film so that a large amount of change in the capacitance may be achieved by low voltage.

Patent Literature 1: JP 4502609 B1.
Patent Literature 2: JP 5000660 B1.

A variable capacitance element including a ferroelectric film has a disadvantage in that that an ESD (Electro-Static Discharge) resistance property is poor compared to an MEMS variable capacitance element or a variable capacitance element of a semiconductor, such as a variable capacitance diode.

Moreover, when the thickness of the ferroelectric film is reduced is certain designs, the control sensitivity (the ratio of a change in the capacitance value to a change in the control voltage) will be increased, but the ESD resistance property will deteriorate due to the reduction in the thickness of the ferroelectric film. That is, upon receiving an ESD that exceeds the ESD resistance property, the surge is applied to the ferroelectric film causing the ferroelectric film to break down. Accordingly, there is a restriction in reducing the thickness of the ferroelectric film from the standpoint of the ESD resistance, and the control sensitivity is also restricted.

SUMMARY OF THE INVENTION

An object of the present disclosure is to provide a variable capacitance device with high ESD resistance property.

A variable capacitance device of the present invention includes a semiconductor substrate, a redistribution layer provided on a main surface of the semiconductor substrate, and a plurality of terminal electrodes including a first input/output terminal, a second input/output terminal and a ground terminal, where a variable capacitance element section that is a ferroelectric thin film is formed in the redistribution layer, the variable capacitance element section being formed from a pair of capacitor electrodes connected to the first input/output terminal and the second input/output terminal, respectively, and a ferroelectric thin film disposed between the pair of capacitor electrodes, and where an ESD protection element connected between the first input/output terminal or the second input/output terminal and the ground terminal is formed in the semiconductor substrate.

According to the structure described above, the variable capacitance element section is formed in the redistribution layer, and the ESD protection element is formed in the semiconductor substrate. Accordingly, isolation between the variable capacitance element section and the ESD protection element section may be easily secured, and a small variable capacitance device with high ESD resistance and high control sensitivity may be configured.

Preferably, an electrode pad is provided, on the main surface of the semiconductor substrate, for connecting the ESD protection element to the ground terminal and the first input/output terminal or the second input/output terminal, and the electrode pad is formed of W or WSi. This allows the electrode pad of the semiconductor substrate to be highly thermal resistant, and allows the variable capacitance element section having a ferroelectric thin film layer which needs to be thermally treated at high temperature to be embedded in the redistribution layer.

Preferably, in plan view, the variable capacitance element section is provided at a position not overlapping the ESD protection element and the electrode pad for the ESD protection element. This allows isolation between the variable capacitance element section and the ESD protection element section to be more easily secured, and also, allows flatness of the underlying portion of the variable capacitance element section to be secured, and the reliability of the variable capacitance element section may be increased.

Preferably, a resistance element is provided between the variable capacitance element section and a control voltage application terminal, and the resistance element is formed on a layer, in the redistribution layer, where the variable capacitance element section is provided, opposite the semiconductor substrate. This eliminates the need to provide a resistance element outside, and the number of elements may be significantly reduced. Also, because the resistance element is formed on a layer where the variable capacitance element section is provided, opposite the semiconductor substrate, flatness of the variable capacitance element section is not negatively affected, and also, isolation between the ESD protection element section and the resistance element may be increased.

Preferably, an insulating layer is provided between the variable capacitance element section and the semiconductor substrate. That is, by forming an insulating layer between the semiconductor substrate and the capacitor electrode, isolation between the ESD protection section and the variable capacitance element section may be further increased.

Accordingly, the present disclosure provides a small ESD-resistant variable capacitance device with high control sensitivity may be achieved.

BRIEF DESCRIPTION OF THE DRAWINGS

FIG. 6A is a schematic plan view, and FIG. 6B is a schematic front view.

DETAILED DESCRIPTION OF THE EMBODIMENTS

First Embodiment

Figure 1:
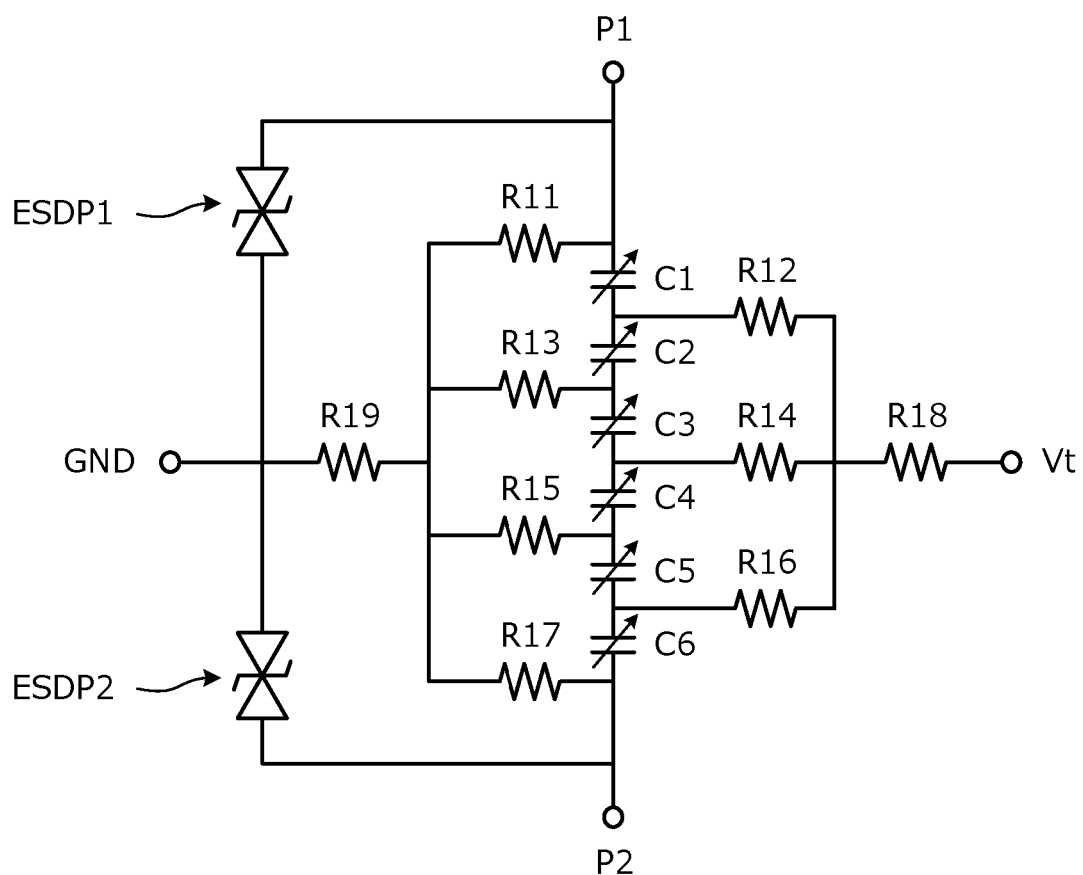
FIG. 1 is a circuit diagram of a variable capacitance device 91 according to a first embodiment.

FIG. 1 is a circuit diagram of a variable capacitance device 91 according to a first embodiment. The variable capacitance device 91 includes variable capacitance elements C1 to C6, RF resistance elements R11 to R19, and ESD protection elements ESDP1, ESDP2.

A capacitance value of the variable capacitance elements C1 to C6 is determined based on a control voltage applied between a control voltage input terminal Vt and a ground terminal GND, and a capacitance value between a first input/output terminal P1 and a second input/output terminal P2 is thereby determined.

Each of the variable capacitance elements C1 to C6 is a ferroelectric capacitor formed from a ferroelectric film whose dielectric constant is changed by an electric field, and capacitor electrodes sandwiching the ferroelectric film to apply voltage thereto. The dielectric constant of the ferroelectric film changes due to the amount of polarization being changed according to the intensity of an applied electric field, and the capacitance value may thus be determined by the control voltage. The control voltage is applied to each capacitor electrode through the RF resistance elements R11 to R19. The RF resistance elements R11 to R19 have equal resistance values. These RF resistance elements R11 to R19 apply the control voltage to each of the variable capacitance elements C1 to C6, and also, function as choke resistors for preventing leakage of an RF signal applied between the terminals P1 and P2 to the control voltage input terminal Vt and the ground terminal GND.

The ESD protection element ESDP1, formed of a Zener diode, is connected between the first input/output terminal P1 and the ground terminal GND, and the ESD protection element ESDP2 is connected between the second input/output terminal P2 and the ground terminal GND. When an ESD surge is applied to the input/output terminals P1, P2 from the outside, the configuration causes ESD current to flows to the ground through the ESD protection elements ESDP1, ESDP2. Accordingly, over-voltage is not applied to the variable capacitance elements C1 to C6, effectively protecting the variable capacitance elements C1 to C6.

Figure 2:
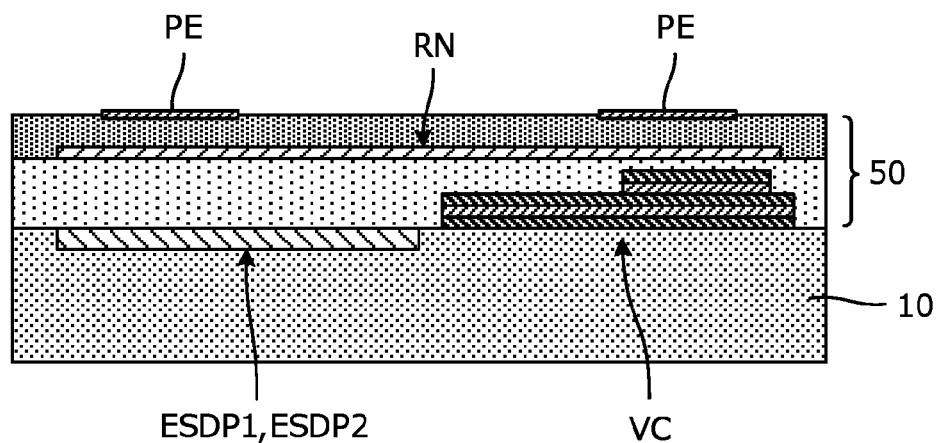
FIG. 2 is a schematic cross-sectional view of the variable capacitance device 91.

FIG. 2 is a schematic cross-sectional view of the variable capacitance device 91. In FIG. 2, a substrate 10 is an Si substrate having a protection film formed on a surface. The ESD protection elements ESDP1, ESDP2 are formed on the surface of the Si substrate 10. Also, a variable capacitance element section VC and a resistance element section RN are formed in a redistribution layer 50 on the Si substrate 10. A plurality of terminal electrodes PE are formed on a surface of the redistribution layer 50. These terminal electrodes PE are used as mounting terminals for mounting the variable capacitance device 91 on a printed wiring board.

Figure 3A:
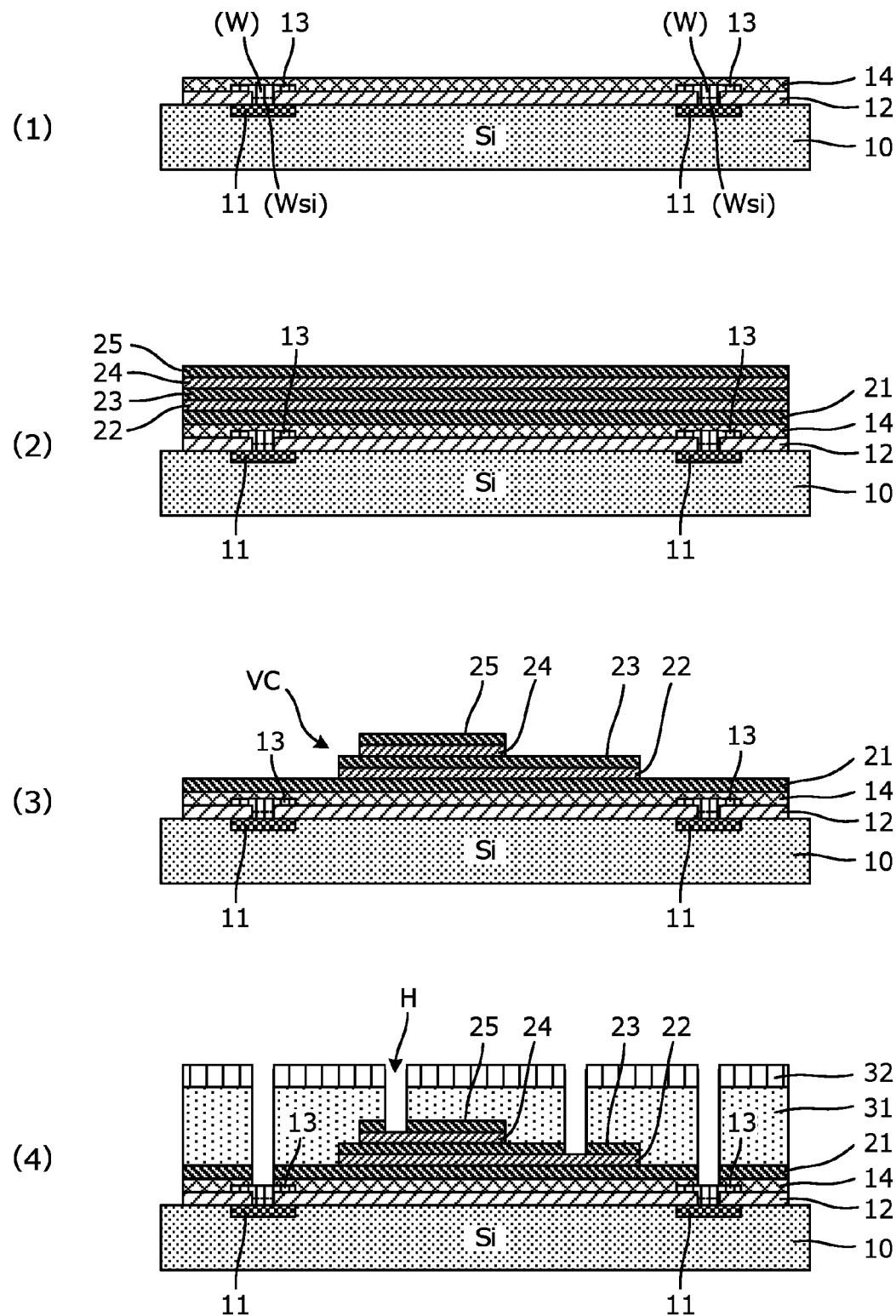
FIG. 3A shows cross-sectional views showing detailed structures and steps (1)-(4) of a manufacturing method of the variable capacitance device 91.
Figure 3B:
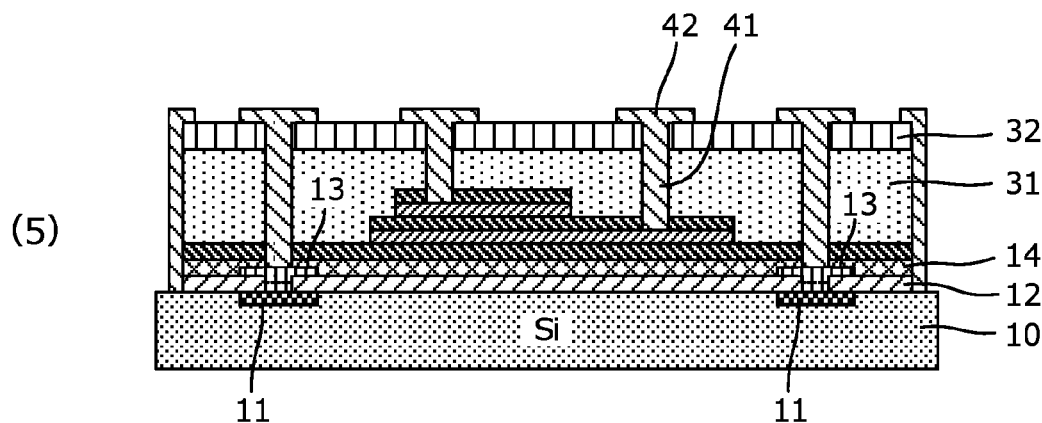
FIG. 3B shows cross-sectional views showing detailed structures and steps (5)-(7), subsequent to those in FIG. 3A, of the manufacturing method of the variable capacitance device 91.
Figure 3B:
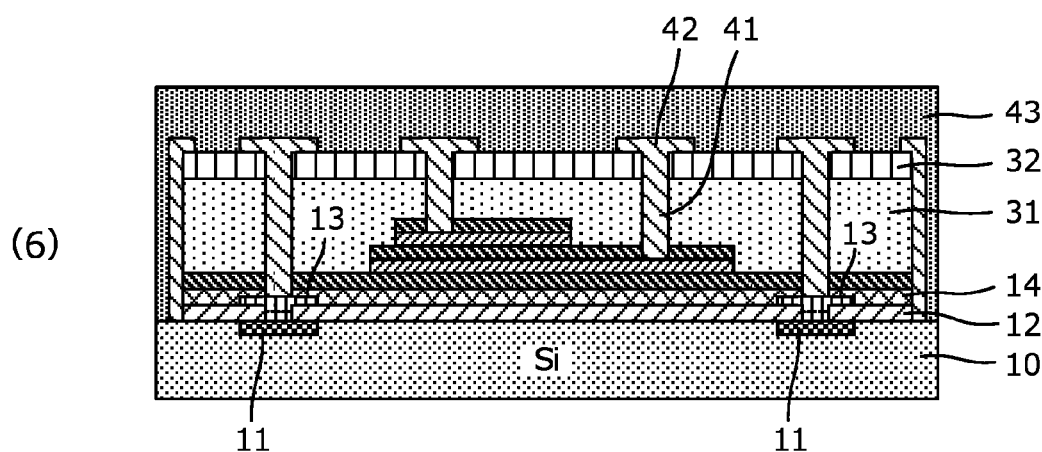
Figure 3B:
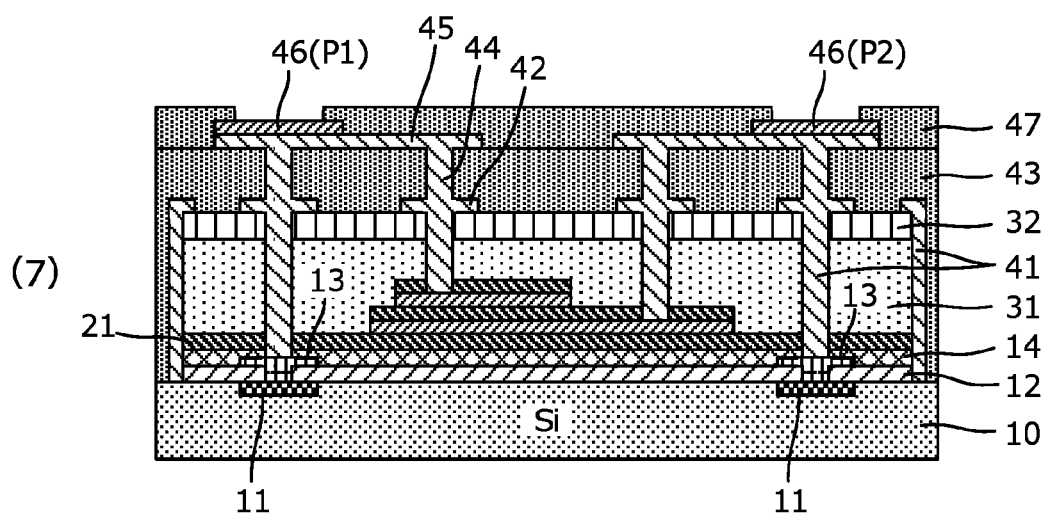

FIGS. 3A and 3B show cross-sectional views of detailed structures and a manufacturing method of the variable capacitance device 91. In the following, description will be given with reference to FIGS. 3A and 3B, in the order of manufacturing, including steps (1) through (4) shown in FIG. 3A and steps (5) through (7) shown in FIG. 5B. One or more of these steps may contain sub-steps as described below.

In step (1), an $SiO_2$ film 12 is formed on the Si substrate 10, and active regions 11 are formed at regions where ESD protection elements are to be formed, by impurity diffusion by ion implantation or the like. Next, electrode pads 13 of tungsten (W) conducted to the active regions 11 are formed, and an SiN insulating film 14 is formed on an entire surface by a CVD method, for example.

The $SiO_2$ film 12 and the SiN insulating film 14 are provided for the purpose of preventing interdiffusion between a BST film 21 described below and the Si substrate 10.

In step (2), a (Ba, Sr) $TiO_3$ film (hereinafter referred to as a "BST film") 21, a Pt electrode film 22, a BST film 23, a Pt electrode film 24, and a BST film 25 are formed in this order on the insulating film 14. These BST films are formed by a spin coating process and a firing process, and the Pt films are formed by sputter deposition. The BST film 21 is used as an adhesion layer to the SiN insulating film 14. The BST film 21 does not affect capacitance, and thus, a film other than the BST film may be used as long as the film acts as an adhesion layer to the SiN insulating film 14. Also, instead of the Pt film, other noble metal materials which are highly conductive and highly oxidation resistant and whose melting points are high, such as Au, may be used. BST film 23 serves as the ferroelectric layer for the variable capacitance element VC, as described herein. Moreover, BST film 25 serves as an additional adhesion layer.

Preferably, the firing temperature for the BST films is 600° C. to 700° C., and a part, of each electrode pad 13, in contact with the active region 11 is made tungsten silicide (WSi) by this heat.

In step (3), the variable capacitance element section VC is formed by performing patterning of the Pt electrode films 22, 24, and the BST films 23, 25 by performing photolithography a predetermined number of times.

In step (4), a polybenzoxazole (PBO) film 32, as an organic protection layer, is formed by forming an SiO$_2$ film 31 by the CVD method or sputter deposition, and applying a PBO film on the SiO$_2$ film 31 by an automatic coater and firing the same. Then, holes H are formed by inductively coupled plasma reactive ion etching (ICP-RIE).

In step (5), a Ti/Cu/Ti film of 0.1 μm/1.0 μm/0.1 μm, for example, is formed on insides of the holes H and on a surface of the PBO film 32 by sputter deposition. Vias 41 are thereby formed at the holes H. Then, patterning is performed on the Ti/Cu/Ti film on the surface of the PBO film 32, and a wiring pattern 42 is formed.

At step (6), a solder resist film 43 is applied and formed. Although not shown in the cross-sections in FIG. 3B, a layer of an RF resistance element is formed in the solder resist layer.

In step (7), holes are then formed in the solder resist film 43, and a Ti/Cu/Ti film is formed on insides of the holes and on a surface of the solder resist film 43. Vias 44 are thereby formed at the holes. Then, patterning is performed on the Ti/Cu/Ti film, and a wiring pattern 45 is formed. Furthermore, terminal electrodes 46 are formed on the wiring pattern 45, and a solder resist film 47 is formed on a surface of a redistribution layer.

Figure 4:
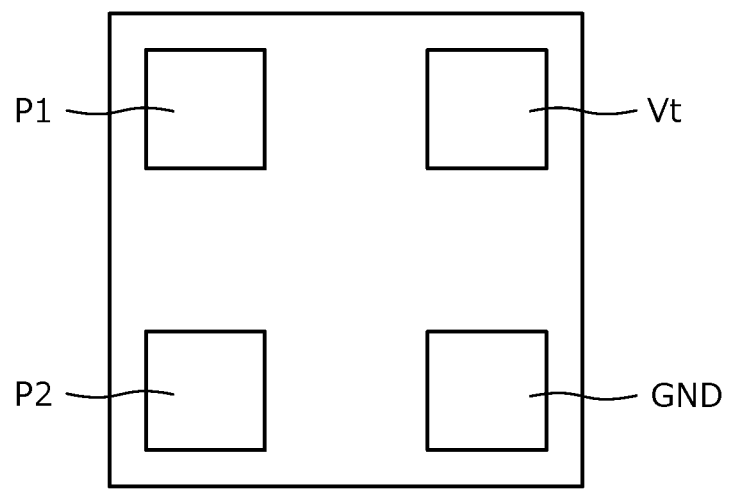
FIG. 4 is a plan view showing a mounting surface side of the variable capacitance device 91.

FIG. 4 is a plan view showing a mounting surface side of the variable capacitance device 91. As shown in FIGS. 2, 3A and 3B, the variable capacitance device 91 of the present embodiment is a one-chip element which is a CSP (Chip size package). The input/output terminals P1, P2, the control voltage input terminal Vt, and the ground terminal GND are arranged on the mounting surface of the chip.

Characteristic structures and effects of the present embodiment are listed as follows.

The variable capacitance element section VC, which includes a ferroelectric thin film, is formed in the redistribution layer 50 provided on a main surface of the Si substrate 10, and the ESD protection elements connected between the first input/output terminal and the ground terminal, and between the second input/output terminal and the ground terminal are formed on the main surface of the semiconductor substrate. Accordingly, the configuration can provide isolation between the variable capacitance element section and the ESD protection element sections, and a small variable capacitance device with high ESD resistance property and high control sensitivity may be structured. Also, a variable capacitance device of a ferroelectric thin film provided with ESD protection elements may be structured as one chip by a semiconductor manufacturing process.

Electrode pads for connecting the ESD protection elements to the ground terminal and a pair of input/output terminals are provided on the main surface of the semiconductor substrate, and the electrode pads are formed of W or WSi. Accordingly, the electrode pads of the semiconductor substrate are highly heat resistant, and a ferroelectric thin film layer which requires thermal treatment at high temperature may be embedded in the redistribution layer.

In plan view, the variable capacitance element section is provided at a position not overlapping the ESD protection elements and the electrode pads 13. That is, the ESD protection element sections are not formed on the semiconductor substrate side of the variable capacitance element section. Accordingly, the underlying portion of the variable capacitance element section can be flat, and the applied thickness of the BST film by spin coating can be even. Thus, a homogeneous and flat BST film may be formed, stable property may be realized, and the reliability of the variable capacitance element section may be increased. Also, isolation between the variable capacitance element section and the ESD protection element sections may be easily secured.

The resistance element section RN connected between the variable capacitance element section VC and a control voltage application terminal is formed on the mounting surface side, of the redistribution layer 50, than the layer where the variable capacitance element section VC is provided. Accordingly, the flatness of the variable capacitance element section is not negatively affected. Also, isolation between the ESD protection element sections and the resistance element may be increased.

As described above, three insulating layers of the SiO$_2$ film 12, the SiN insulating film 14 and the BST film 21 are provided between the variable capacitance element section VC and the semiconductor substrate 10. That is, by forming a plurality of insulating layers between the semiconductor substrate 10 and the Pt electrode film 22, the isolation between the ESD protection element section and the variable capacitance element section may be further increased.

Additionally, other than the W electrode, any metal material that can stand the firing temperature of the BST film may be used. For example, the electrode pad may be formed of Mo or Pt.

Furthermore, as the ESD protection element, various semiconductor diodes using a semiconductor substrate, such as a PN diode or a MOS diode, may be used instead of the Zener diode.

Second Embodiment

Figure 5A:
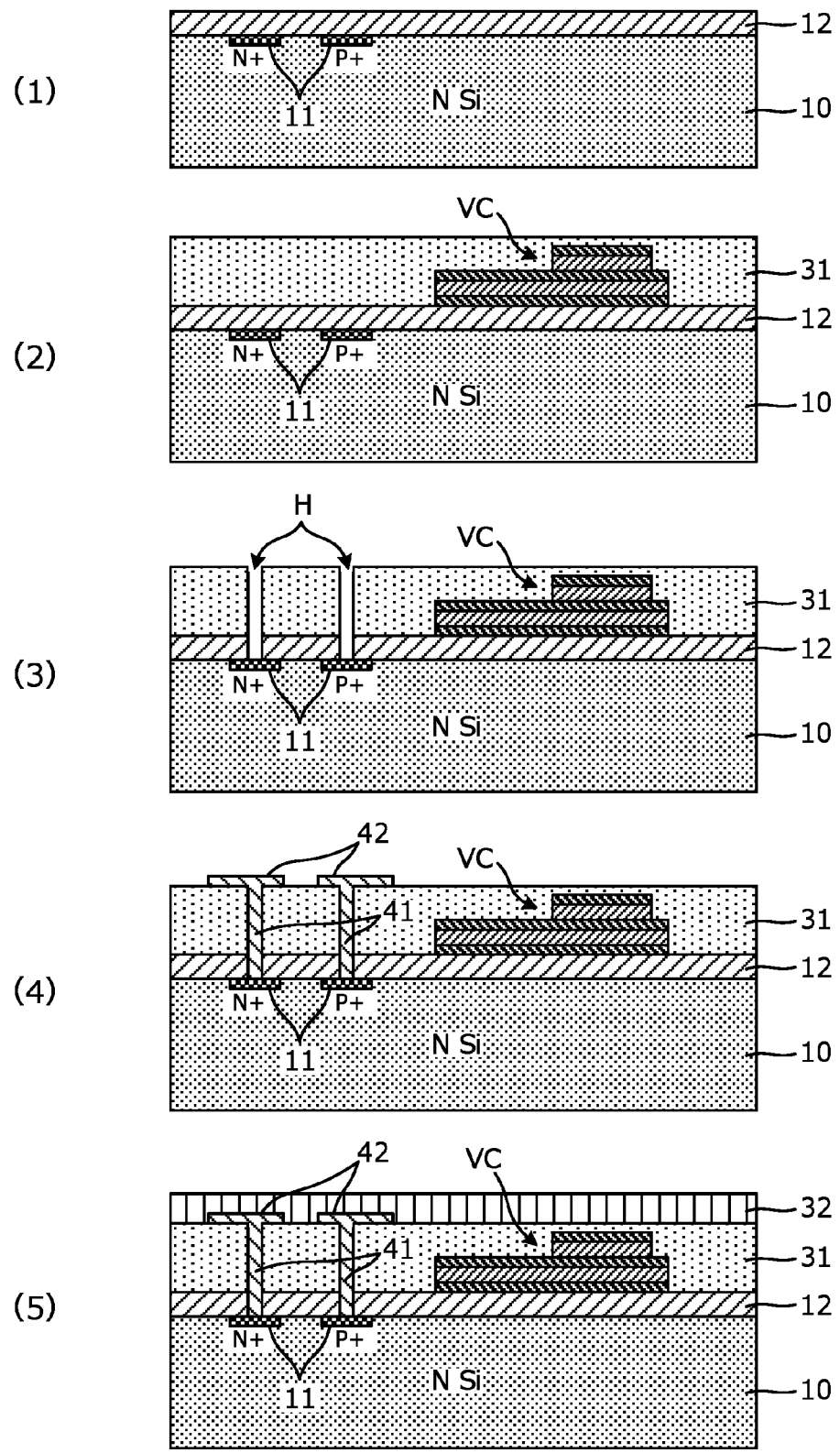
FIG. 5A shows cross-sectional views showing structures and steps (1)-(5) of a manufacturing method of a variable capacitance device 92 according to a second embodiment.
Figure 5B:
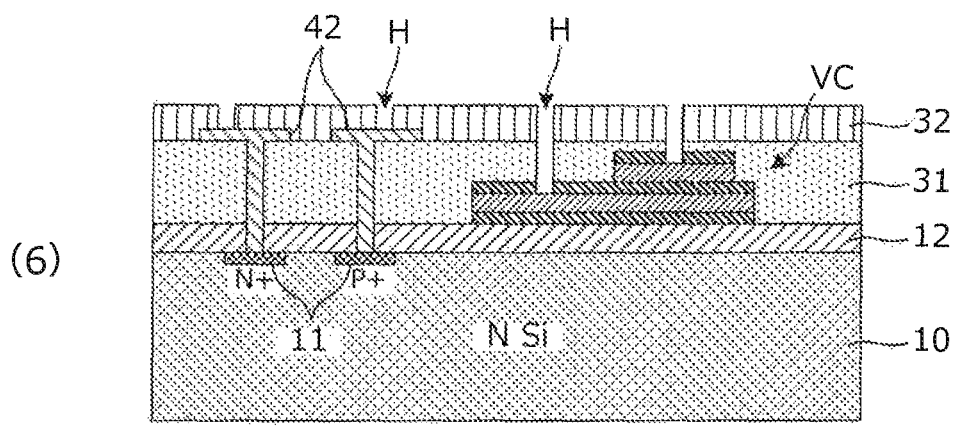
FIG. 5B shows cross-sectional views showing detailed structures and steps (6)-(7), subsequent to those in FIG. 5A, of the manufacturing method of the variable capacitance device 92.
Figure 5B:
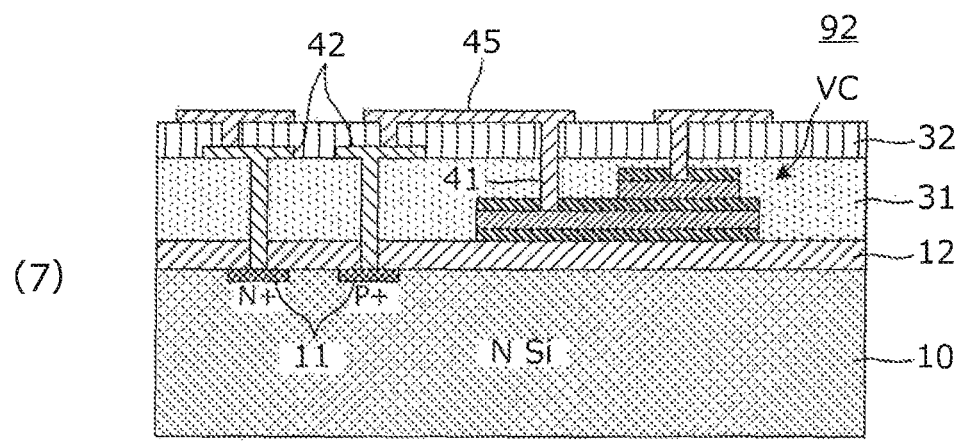

FIGS. 5A and 5B show cross-sectional views showing structures and a manufacturing method of a variable capacitance device 92 according to a second embodiment. The circuit diagram is the same as the one shown in FIG. 1 for the first embodiment.

In the following, the structure and the manufacturing method of the variable capacitance device according to the present embodiment will be described in order with reference to FIGS. 5A and 5B. As shown, FIGS. 5A and 5B will be described in the order of manufacturing, including steps (1) through (5) shown in FIG. 3A and steps (6) through (7) shown in FIG. 5B. One or more of these steps may contain sub-steps as described below.

In step (1), an SiO$_2$ film 12 is formed on an N-type Si substrate 10, and active regions 11 are formed at regions where ESD protection elements are to be formed, by impurity diffusion by ion implantation or the like.

In step (2), BST films and Pt electrode films are alternately laminated on the SiO$_2$ film 12, and a variable capacitance element section VC is formed by performing patterning on the films. Also, an SiO$_2$ film 31 is formed on a surface of the SiO$_2$ film 12 by the CVD method or sputter deposition.

In step (3), holes H that reach the active regions 11 are formed in the SiO$_2$ film 31 by the ICP-RIE method.

In step (4), an Al film is formed on a surface of the SiO$_2$ film 31 by sputter deposition. Vias 41 are thereby formed at the holes H. Then, patterning is performed on the Al film on the surface of the SiO$_2$ film 31, and a wiring pattern 42 is formed.

In step (5), A polybenzoxazole (PBO) film 32 as an organic protection layer is formed by applying a PBO film on the SiO$_2$ film 31 by an automatic coater and firing the same.

In step (6), holes H that reach the wiring pattern 42 and the electrode films of the variable capacitance element section VC are formed by the ICP-RIE method.

Finally, In step (7), a Ti/Cu/Ti film is formed by sputter deposition on insides of the holes H and on a surface of the PBO film 32. Vias 41 are thereby formed at the holes H. Then, patterning is performed on the Ti/Cu/Ti film on the surface of the PBO film 32, and a wiring pattern 45 is formed.

Moreover, terminal electrodes 46 can be formed by the same steps as step (6) and the following step described above with respect to FIG. 3B.

Figure 6A:
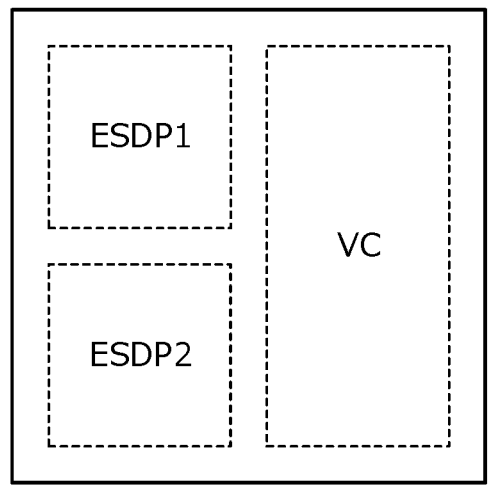
FIGS. 6A and 6B are schematic views showing element arrangement inside the variable capacitance device 92.
Figure 6B:
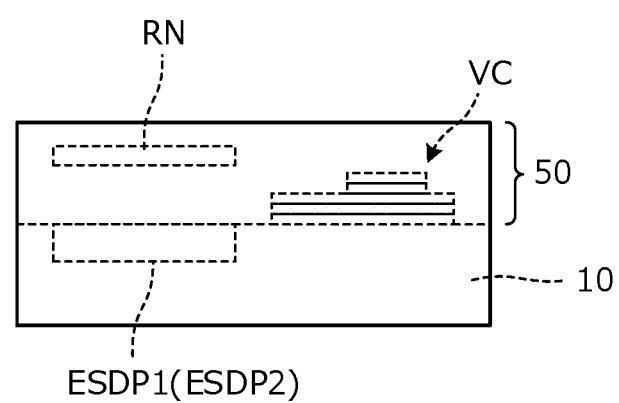

FIGS. 6A and 6B are schematic views showing element arrangement inside the variable capacitance device 92. FIG. 6A is a plan view, and FIG. 6B is a front view. According to the variable capacitance device 92 of the present embodiment, in plan view, the variable capacitance element section VC is provided at a position not overlapping ESD protection elements ESDP1, ESDP2 and electrode pads for the ESD protection elements. Furthermore, a resistance element section RN connected between the variable capacitance element section VC and a control voltage application terminal is formed on the mounting surface side, of a redistribution layer 50, than the layer where the variable capacitance element section VC is provided.

According to the present embodiment, a wiring pattern is formed after firing the BST films of the variable capacitance element section VC. Thus, it is not necessary to use tungsten (W) for the electrode pads that are in contact with the active regions 11, and also, Al may be used for the wiring pattern, instead of Ti/Cu/Ti, and the cost may be reduced.

Third Embodiment

Figure 7:
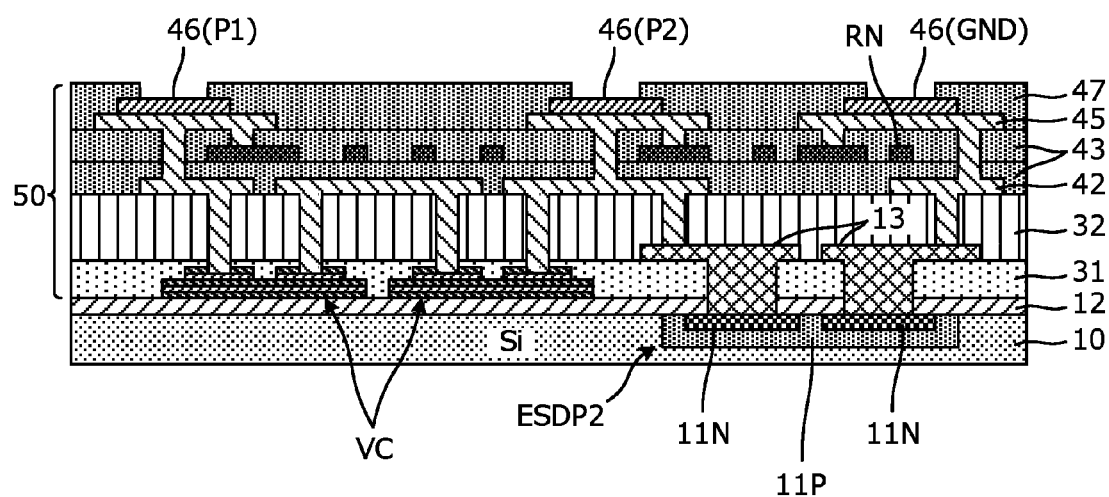
FIG. 7 is a cross-sectional view of a variable capacitance device 93 according to a third embodiment.
Figure 8A:
FIG. 8A shows cross-sectional views of details structures and steps (1)-(6) of a manufacturing method of the variable capacitance device 93.
Figure 8A:
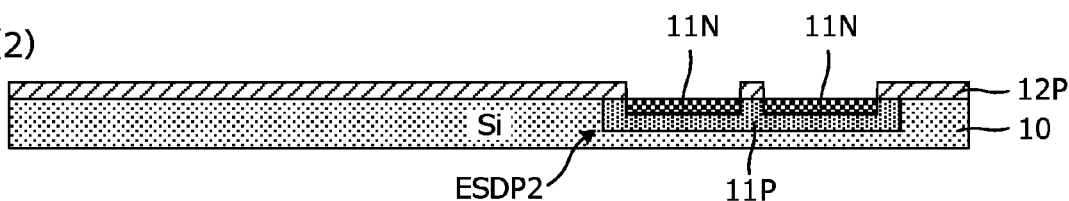
Figure 8A:
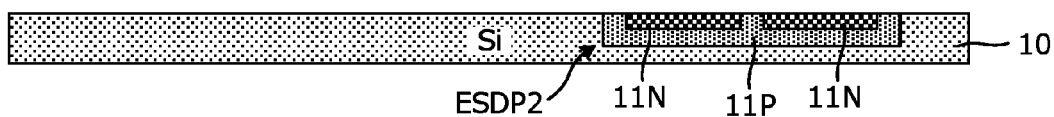
Figure 8A:
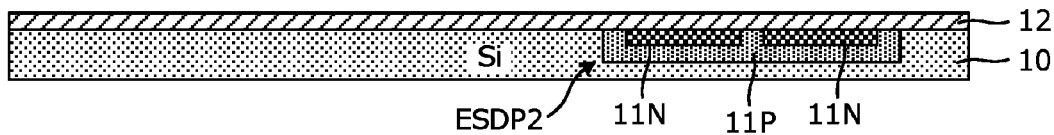
Figure 8A:
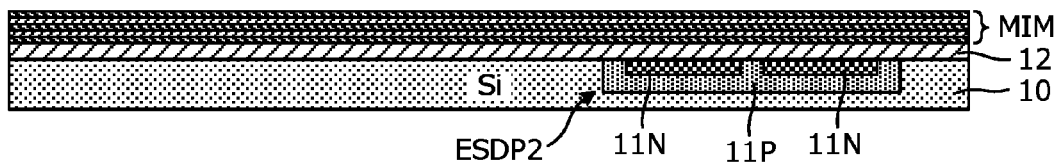
Figure 8A:
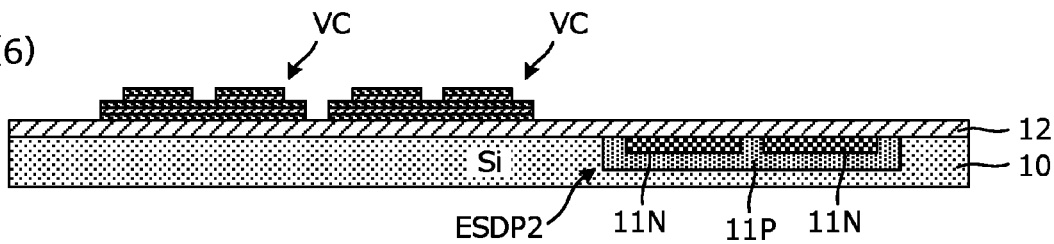
Figure 8B:
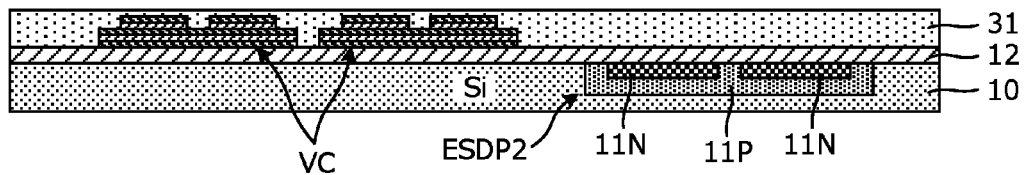
FIG. 8B shows cross-sectional views showing detailed structures and steps (7)-(11), subsequent to those in FIG. 8A, of the manufacturing method of the variable capacitance device 93.
Figure 8B:
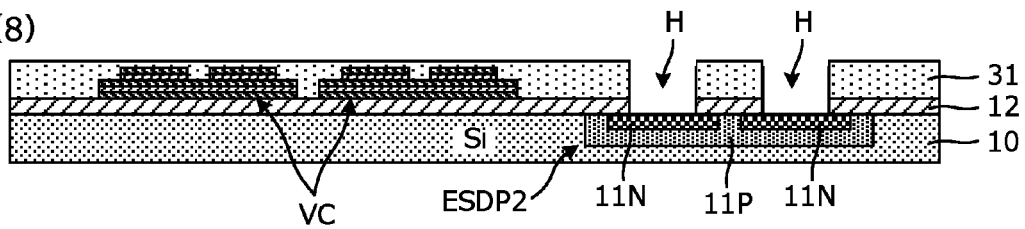
Figure 8B:
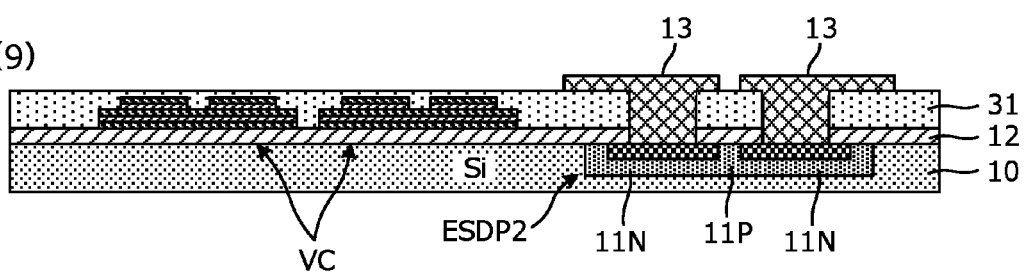
Figure 8B:
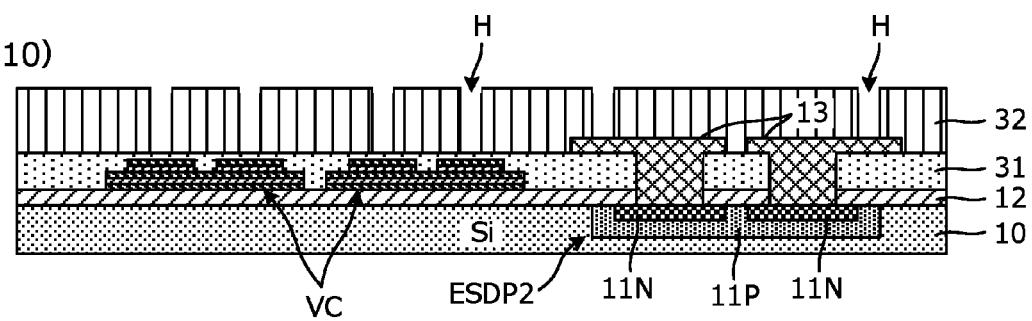
Figure 8B:
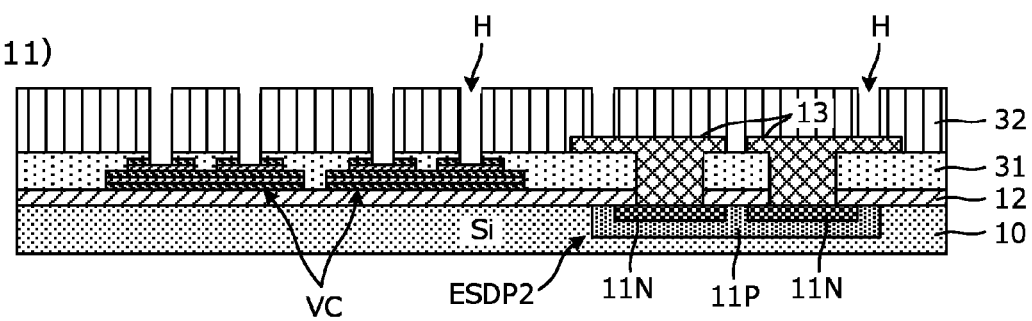
Figure 8C:
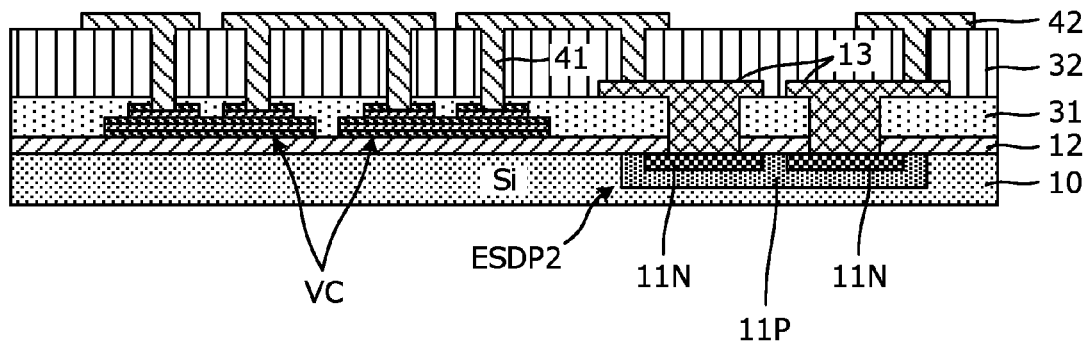
FIG. 8C shows cross-sectional views showing detailed structures and steps (12)-(14), subsequent to those in FIG. 8B, of the manufacturing method of the variable capacitance device 93.
Figure 8C:
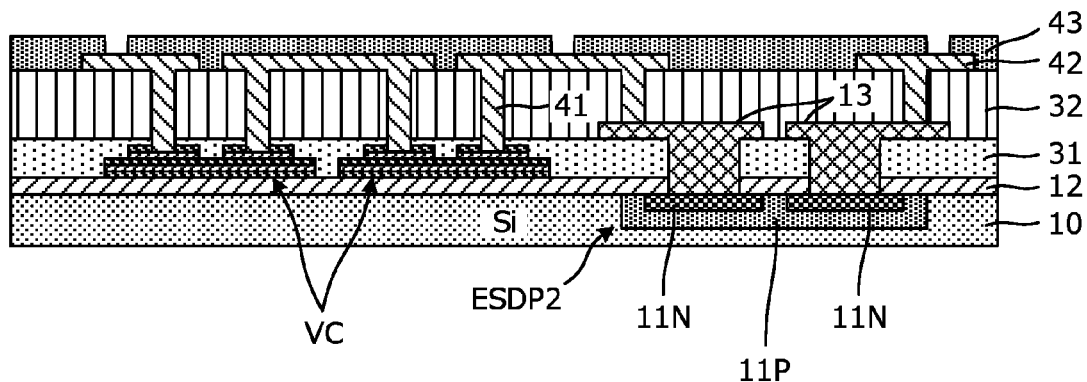
Figure 8C:
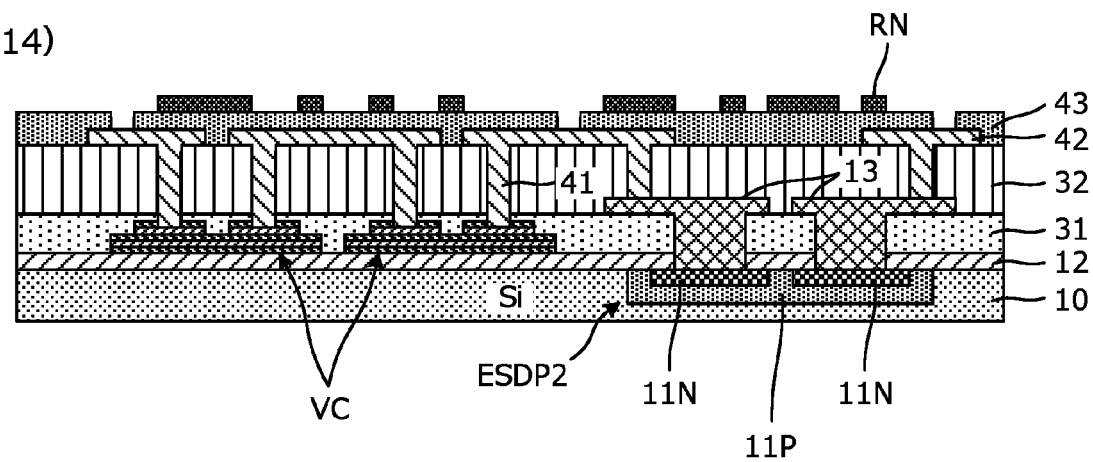
Figure 8D:
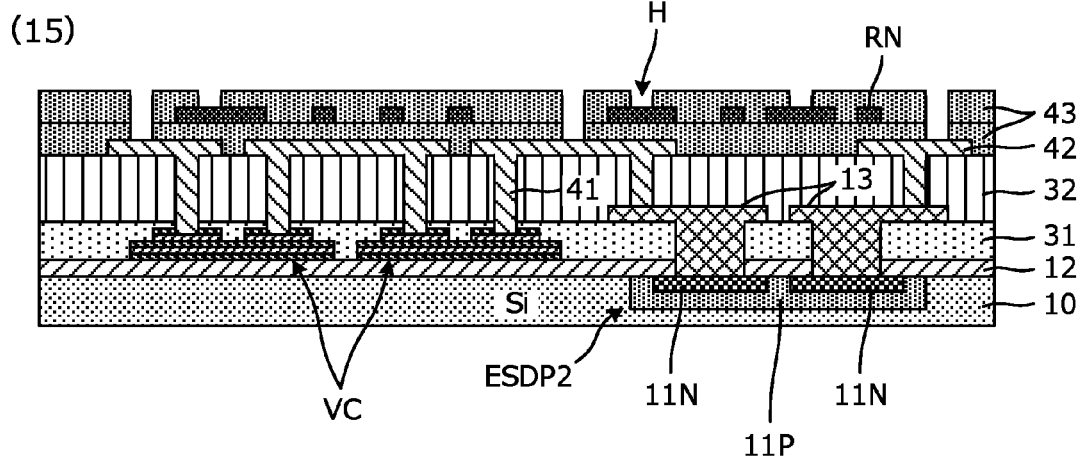
FIG. 8D shows cross-sectional views showing detailed structures and steps (15)-(17), subsequent to those in FIG. 8C, of the manufacturing method of the variable capacitance device 93.
Figure 8D:
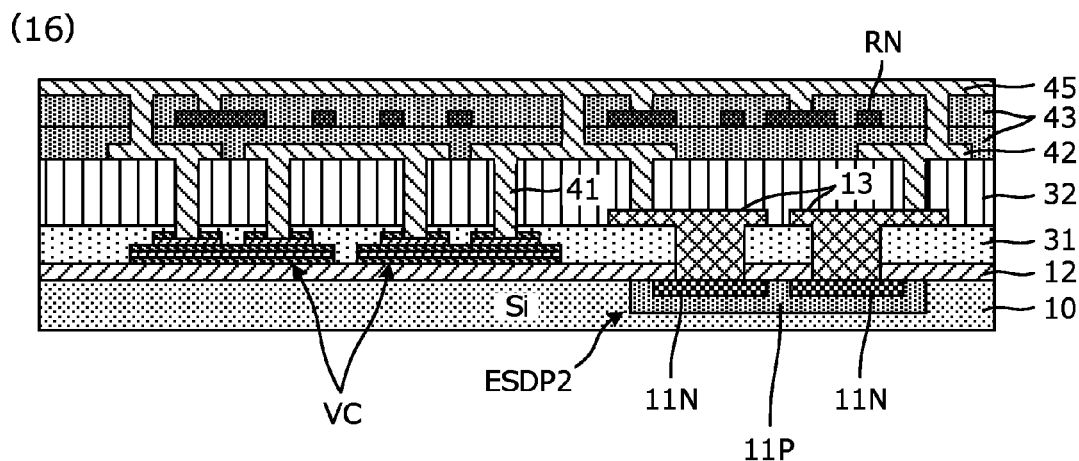
Figure 8D:
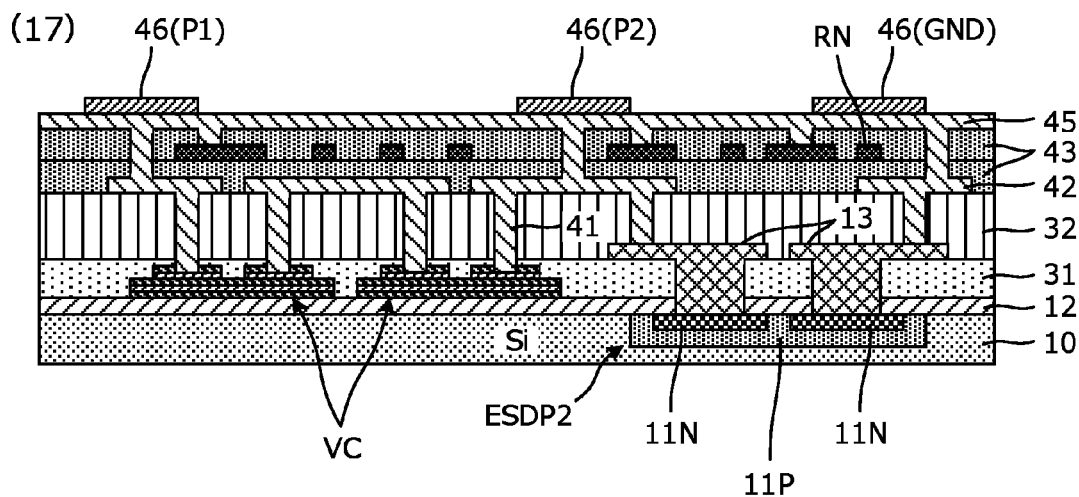
Figure 8E:
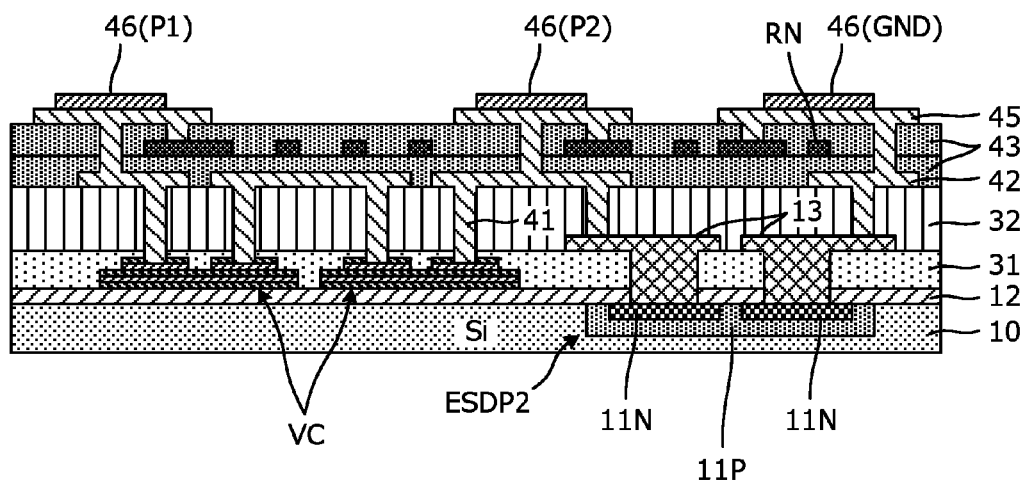
FIG. 8E shows cross-sectional views showing detailed structures and steps (18)-(19), subsequent to those in FIG. 8D, of the manufacturing method of the variable capacitance device 93.
Figure 8E:
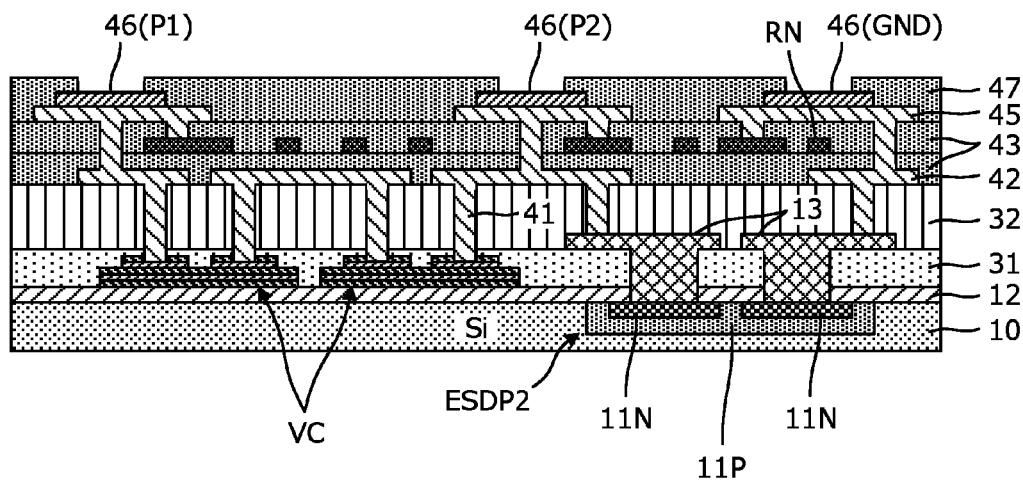

FIG. 7 is a cross-sectional view of a variable capacitance device 93 according to a third embodiment. As shown, the variable capacitance device 93 includes variable capacitance element sections VC, resistance element sections RN, an ESD protection element ESDP2, and the like.

FIGS. 8A to 8E are cross-sectional views showing structures and a manufacturing method of the variable capacitance device 93.

In the following, the structure and the manufacturing method of the variable capacitance device according to the present embodiment will be described in order with reference to FIGS. 8A to 8E, including manufacturing steps (1) through (19), respectively. Moreover, one or more of these steps may contain sub-steps as described below.

In step (1), an N-type Si substrate 10 is prepared.

In step (2), an $SiO_2$ film 12P is formed on the N-type Si substrate 10, and active regions 11P, 11N are formed at regions where an ESD protection element of the Si substrate 10 is formed, by impurity diffusion by ion implantation or the like.

In step (3), the $SiO_2$ film 12P is removed according to known manufacturing methods, such as those described herein.

In step (4), the $SiO_2$ film 12 is formed again according to known manufacturing methods, such as those described herein.

In step (5), a MIM layer where BST films and Pt electrode films are alternately laminated is formed. These films are formed by repeatedly performing a spin coating step and a firing step.

In step (6), the variable capacitance element sections VC are formed by performing patterning of the Pt electrode films and the BST films by performing photolithography a predetermined number of times.

In step (7), an $SiO_2$ film 31 is formed by the CVD method or sputter deposition.

In step (8), holes H are formed by the ICP-RIE method.

In step (9), sputter deposition and patterning of Al are performed to form electrode pads 13.

In step (1), a polybenzoxazole (PBO) film 32 as an organic protection layer is formed by applying a PBO film by an automatic coater and firing the same. Then, holes H are formed in the PBO film 32 by the ICP-RIE method.

In step (11), holes H are formed in the $SiO_2$ film 31 and the BST films on upper surfaces of the variable capacitance element sections VC by the ICP-RIE method.

In step (12), a Ti/Cu/Ti film is formed by sputter deposition on insides of the holes H and on a surface of the PBO film 32. Vias 41 are thereby formed at the holes H. Then, patterning is performed on the Ti/Cu/Ti film on the surface of the PBO film 32, and a wiring pattern 42 is formed.

In step (13), a solder resist film 43 is formed on a surface of the PBO film 32, and holes are formed at predetermined positions.

In step (14), the resistance element sections RN are formed by forming and patterning an NiCr/Si film on a surface of the solder resist film 43.

In step (15), a solder resist film 43 is formed, and holes are formed at predetermined positions, according to known manufacturing methods, such as those described herein.

In step (16), a Ti/Cu/Ti film is formed on a surface of the solder resist film 43, according to known manufacturing methods, such as those described herein.

In step (17), an Au/Ni plated film is formed, and terminal electrodes 46 are formed by patterning.

In step (18), a wiring pattern 45 is formed by etching the Ti/Cu/Ti film.

In step (19), a solder resist film 47 is formed, and holes are formed at positions of the terminal electrodes 46, according to known manufacturing methods, such as those described herein.

Finally, the wafer is cut into chips, and the variable capacitance device 93 shown in FIG. 7 is obtained.

According to the present embodiment, the resistance element sections RN connected between the variable capacitance element sections VC and the control voltage application terminal are formed on the mounting surface side, of a redistribution layer 50, than the layer where the variable capacitance element sections VC are provided, and at regions overlapping the regions where the variable capacitance element sections VC and the ESD protection elements ESDP1, ESDP2 are formed. Accordingly, a variable capacitance device with a small footprint may be configured without the flatness of the variable capacitance element sections being negatively affected.

Fourth Embodiment

In a fourth embodiment, a communication circuit provided with a variable capacitance device will be described.

Figure 9:
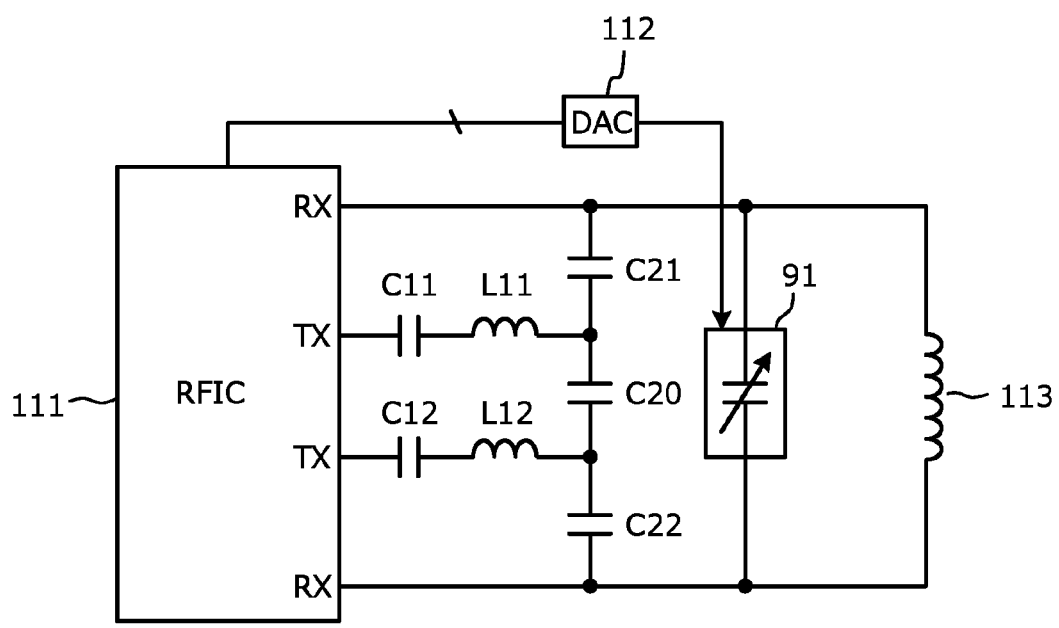
FIG. 9 is a circuit diagram of a communication circuit according to a fourth embodiment, provided with a variable capacitance device.

FIG. 9 is a circuit diagram of a communication circuit provided with a variable capacitance device. The communication circuit is an example of an NFC module. The communication circuit includes an RFIC 111, an antenna coil 113, and a variable capacitance device 91. In FIG. 9, the antenna coil 113 functions as a radiating element, and magnetically couples with a coil antenna of a communication counterpart.

Capacitors C21, C22 are elements for adjusting a degree of coupling between the RFIC 111 and the antenna coil 113. Also, inductors L11, L12 and capacitors C11, C12, C20 configure a transmission filter. For example, in a case where the communication circuit operates in a card mode, the RFIC 111 operates passively, and thus, the RFIC 111 generates a source voltage from an input signal input to an RX terminal and reads a received signal, and at the time of transmission, performs load modulation of a circuit (load) connected to a TX terminal. Furthermore, in a case where the communication circuit operates in a reader/writer mode, for example, the RFIC 111 operates actively, and thus, at the time of transmission, the RFIC 111 opens the RX terminal and transmits a transmission signal from the TX terminal, and at the time of reception, the RFIC 111 opens the TX terminal and inputs a received signal from the RX terminal. The RFIC 111 applies a control voltage to the variable capacitance device 91 through a DA converter 112. In this manner, with the communication circuit, impedance from the RFIC 111 toward the antenna coil 113 changes depending on the operation mode. The capacitance value of the variable capacitance device 91 is controlled such that the resonance frequency of an antenna circuit is optimized according to the operation mode (i.e. such that the impedance from the RFIC 111 toward the antenna coil is matched).

REFERENCE SIGNS LIST

C1 variable capacitance element
C11, C12, C20, C21, C22 capacitor
ESDP1, ESDP2 ESD protection element
GND ground terminal
H hole
L11, L12 inductor
P1 first input/output terminal
P2 second input/output terminal
PE terminal electrode
R11 to P19 RF resistance element
RN resistance element section
VC variable capacitance element section
Vt control voltage input terminal
10 semiconductor substrate
11, 11P, 11N active region
12, 12P SiO$_2$ film
13 electrode pad
14 SiN insulating film
21, 23, 25 BST film
22, 24 Pt electrode film
31 SiO$_2$ film
32 PBO film
41, 44 via
42, 45 wiring pattern
43, 47 solder resist film
46 terminal electrode
50 redistribution layer
91 to 93 variable capacitance device
111 RFIC
112 DA converter
113 antenna coil

The invention claimed is:

1. A variable capacitance device, comprising:
a semiconductor substrate;
a redistribution layer disposed on a surface of the semiconductor substrate;
a plurality of terminal electrodes including a first input/output terminal, a second input/output terminal, a control voltage terminal and a ground terminal;
a variable capacitance element formed in the redistribution layer from a pair of capacitor electrodes electrically connected to the first input/output terminal and the second input/output terminal, respectively, and a ferroelectric thin film disposed between the pair of capacitor electrodes;
an ESD protection element formed in the semiconductor substrate and being electrically connected between either the first input/output terminal or the second input/output terminal and the ground terminal;
one or more resistance elements, the control voltage input terminal being electrically connected to the variable capacitance element through one or more of the resistance elements such that the capacitance of the variable capacitance element varies as a function of a control voltage applied to the control voltage input terminal; and
the physical arrangement of the one or more of the resistance elements, the ESD protection element, the variable capacitive element and the plurality of terminal electrodes being such that the one or more resistance elements are physically located between the ESD protection element and the plurality of terminal electrodes and that the one or more resistance elements are physically located between the variable capacitance element and the plurality of terminal electrodes.

2. The variable capacitance device according to claim 1, wherein an electrode pad is disposed on the surface of the semiconductor substrate for connecting the ESD protection element to the ground terminal and either the first input/output terminal or the second input/output terminal.

3. The variable capacitance device according to claim 2, wherein the electrode pad comprises W or WSi.

4. The variable capacitance device according to claim 2, wherein the variable capacitance element is disposed at a position in a plan view of the variable capacitance device that does not overlap the at least one ESD protection element and the electrode pad.

5. The variable capacitance device according to claim 1, further comprising a silicon dioxide layer extending a length of the surface of the semiconductor substrate.

6. The variable capacitance device according to claim 2, wherein the electrode pad is physically disposed above the ESD protection element.

7. The variable capacitance device according to claim 1, wherein the resistance element is physically disposed between the variable capacitance element and the control voltage input terminal.

8. The variable capacitance device according to claim 7, wherein the resistance element is formed on a layer in the redistribution layer with the variable capacitance element physically disposed between the resistance element and the semiconductor substrate.

9. The variable capacitance device according to claim 1, further comprising an insulating layer which is physically disposed between the variable capacitance element and the semiconductor substrate.

10. The variable capacitance device according to claim 9, further comprising a silicon dioxide layer disposed on the semiconductor substrate, the insulating layer being disposed on the silicon dioxide layer.

11. The variable capacitance device according to claim 1, wherein the ESD protection element is a first ESD protection element and the variable capacitance device further includes a second ESD protection element, the first and second ESD protection elements being electrically connected between the first and second input/output terminals, respectively, and the ground terminal is formed in the semiconductor substrate.

12. The variable capacitance device according to claim 11, wherein a first electrode of the pair of capacitor electrodes is electrically connected to one of the first and second ESD protection elements and a second electrode of the pair of capacitor electrodes is electrically connected to another of the first and second ESD protection elements.

13. The variable capacitance device according to claim 1, wherein the ferroelectric thin film comprises a BST film.

14. The variable capacitance device according to claim 1, further comprising a protection layer disposed on the redistribution layer.

15. The variable capacitance device according to claim 14, further comprising a resistive film disposed on the protection layer, the first and second input/output terminals being disposed on the resistive film.

16. The variable capacitance device according to claim 15, further comprising a plurality of vias connecting one of the first and second input/output terminals to one of a respective electrode of the pair of capacitor electrodes and an active region formed in the semiconductor substrate for the ESD protection element.

* * * * *